United States Patent
Ching et al.

(10) Patent No.: US 9,306,069 B2
(45) Date of Patent: Apr. 5, 2016

(54) ISOLATION STRUCTURE OF FIN FIELD EFFECT TRANSISTOR

(71) Applicant: Taiwan Semiconductor Manufacturing Company, Ltd., Hsin-Chu (TW)

(72) Inventors: Kuo-Cheng Ching, Zhubei (TW); Guan-Lin Chen, Hsin-Chu (TW); Chao Hsiung Wang, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 14/024,148

(22) Filed: Sep. 11, 2013

(65) Prior Publication Data
US 2015/0069474 A1 Mar. 12, 2015

(51) Int. Cl.
*H01L 29/78* (2006.01)
*H01L 21/762* (2006.01)
*H01L 29/10* (2006.01)
*H01L 29/66* (2006.01)

(52) U.S. Cl.
CPC ............ *H01L 29/785* (2013.01); *H01L 21/762* (2013.01); *H01L 29/1083* (2013.01); *H01L 29/66795* (2013.01); *H01L 29/7842* (2013.01); *H01L 29/7848* (2013.01); *H01L 29/7849* (2013.01)

(58) Field of Classification Search
None
See application file for complete search history.

(56) References Cited

U.S. PATENT DOCUMENTS

| | | | |
|---|---|---|---|
| 8,362,572 B2 | 1/2013 | Huang et al. | |
| 2007/0120156 A1 | 5/2007 | Liu et al. | |
| 2007/0267695 A1 | 11/2007 | Lee | |
| 2009/0278196 A1 | 11/2009 | Chang et al. | |
| 2010/0163971 A1 | 7/2010 | Hung et al. | |
| 2011/0207309 A1* | 8/2011 | Izumida et al. | 438/514 |
| 2012/0193751 A1* | 8/2012 | Kawasaki et al. | 257/506 |
| 2012/0319211 A1 | 12/2012 | Van Dal et al. | |
| 2014/0011341 A1 | 1/2014 | Maszara et al. | |
| 2014/0357029 A1 | 12/2014 | Loubet et al. | |

(Continued)

OTHER PUBLICATIONS

Tsai, J. C. C. et al. "Point Defect Generation during Phosphorus Diffusion in Silicon," Journal of the Electrochemical Society 1987, vol. 134, Issue 6, Mar. 14, 1986, pp. 1508-1518.

(Continued)

*Primary Examiner* — Yu Chen
*Assistant Examiner* — Nilufa Rahim
(74) *Attorney, Agent, or Firm* — Slater & Matsil, L.L.P.

(57) ABSTRACT

The disclosure relates to a fin field effect transistor (FinFET). An exemplary FinFET comprises a substrate comprising a major surface; a fin structure protruding from the major surface comprising a lower portion comprising a first semiconductor material having a first lattice constant; an upper portion comprising the first semiconductor material, wherein a bottom portion of the upper portion comprises a dopant with a first peak concentration; a middle portion between the lower portion and upper portion, wherein the middle portion comprises a second semiconductor material having a second lattice constant different from the first lattice constant; and an isolation structure surrounding the fin structure, wherein a portion of the isolation structure adjacent to the bottom portion of the upper portion comprises the dopant with a second peak concentration equal to or greater than the first peak concentration.

20 Claims, 12 Drawing Sheets

(56) References Cited

U.S. PATENT DOCUMENTS

2014/0377926 A1* 12/2014 Kim et al. .................... 438/289
2015/0024573 A1    1/2015 Jacob et al.

OTHER PUBLICATIONS

Deal, B.E. et al., "Thermal Oxidation of Heavily Doped Silicon," Journal of the Electrochemical Society 1965, vol. 112, Issue 4, Sep. 1964, pp. 430-435.

* cited by examiner

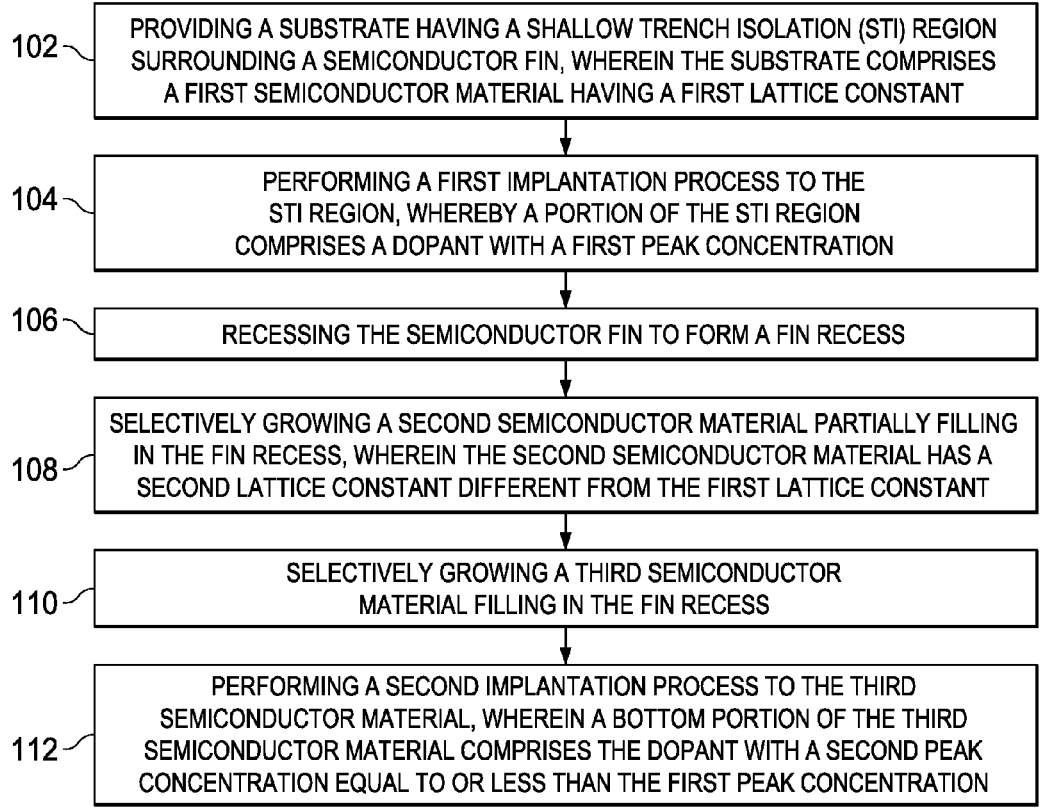
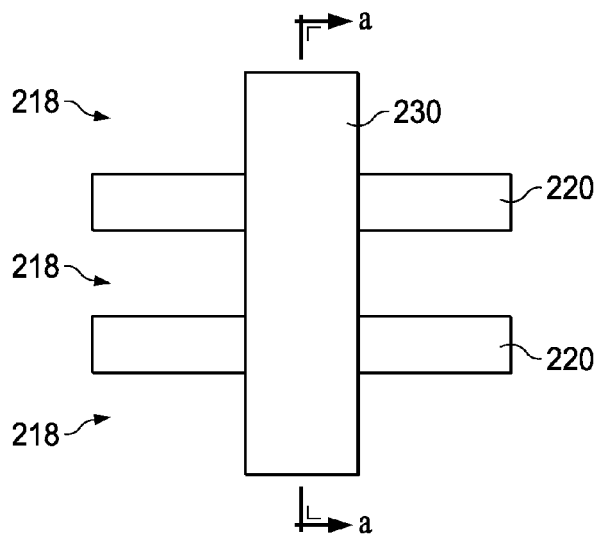

ISOLATION STRUCTURE OF FIN FIELD EFFECT TRANSISTOR

TECHNICAL FIELD

The disclosure relates to integrated circuit fabrication, and more particularly to a fin field effect transistor with an isolation structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, substrate punch-through effect causes high leakage current of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flowchart illustrating a method of fabricating a FinFET according to various aspects of the present disclosure;

FIG. 2 shows a top view of a FinFET comprising an isolation structure according to various aspects of the present disclosure;

DESCRIPTION

Figure 3:
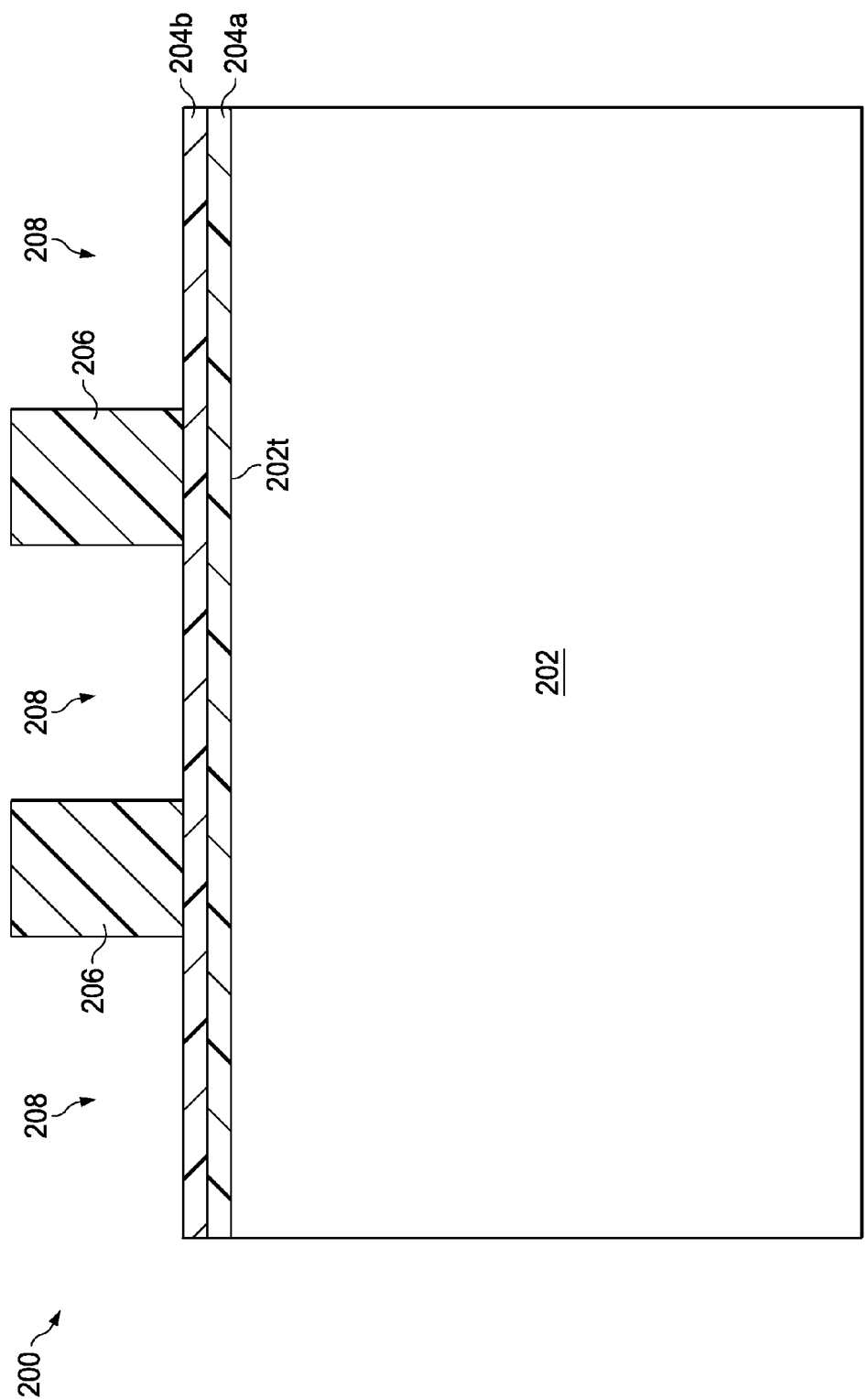
FIGS. 3-11 are cross-sectional views of a FinFET at various stages of fabrication according to various embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a fin field effect transistor (FinFET) according to various aspects of the present disclosure. The method 100 begins with step 102 in which a substrate having a shallow trench isolation (STI) region surrounding a semiconductor fin is provided, wherein the substrate comprises a first semiconductor material having a first lattice constant. The method 100 continues with step 104 in which a first implantation process is performed to the STI region, whereby a portion of the STI region comprises a dopant with a first peak concentration. The method 100 continues with step 106 in which the semiconductor fin is recessed to form a fin recess. The method 100 continues with step 108 in which a second semiconductor material partially filling in the fin recess is selectively grown, wherein the second semiconductor material has a second lattice constant different from the first lattice constant. The method 100 continues with step 110 in which a third semiconductor material filling in the fin recess is selectively grown. The method 100 continues with step 112 in which a second implantation process is performed to the third semiconductor material, wherein a bottom portion of the third semiconductor material comprises the dopant with a second peak concentration equal to or less than the first peak concentration. The discussion that follows illustrates embodiments of FinFETs that can be fabricated according to the method 100 of FIG. 1.

Figure 12:
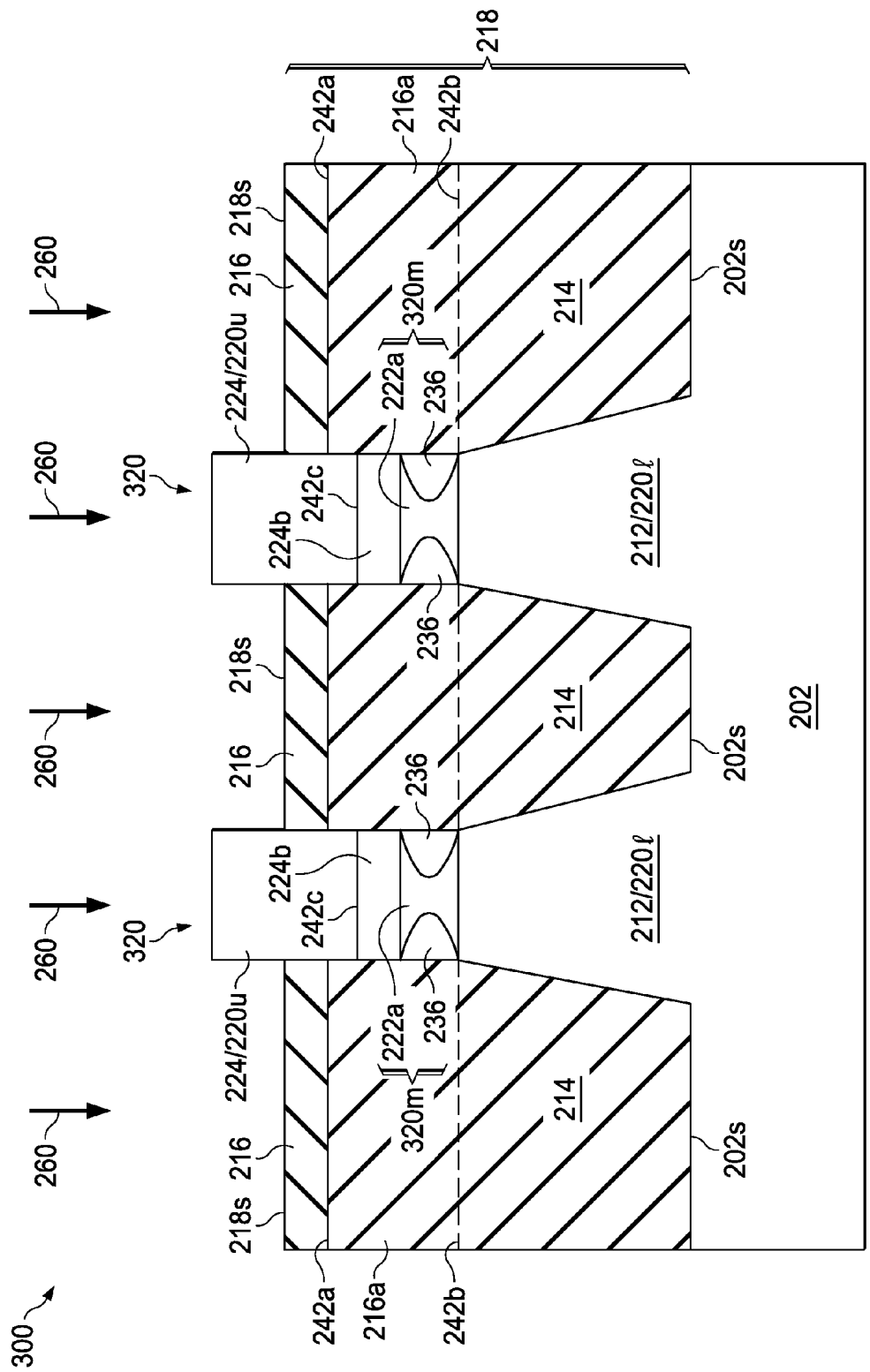
FIGS. 12 and 13 are cross-sectional views of a FinFET at various stages of fabrication according to various embodiment of the present disclosure.
Figure 13:
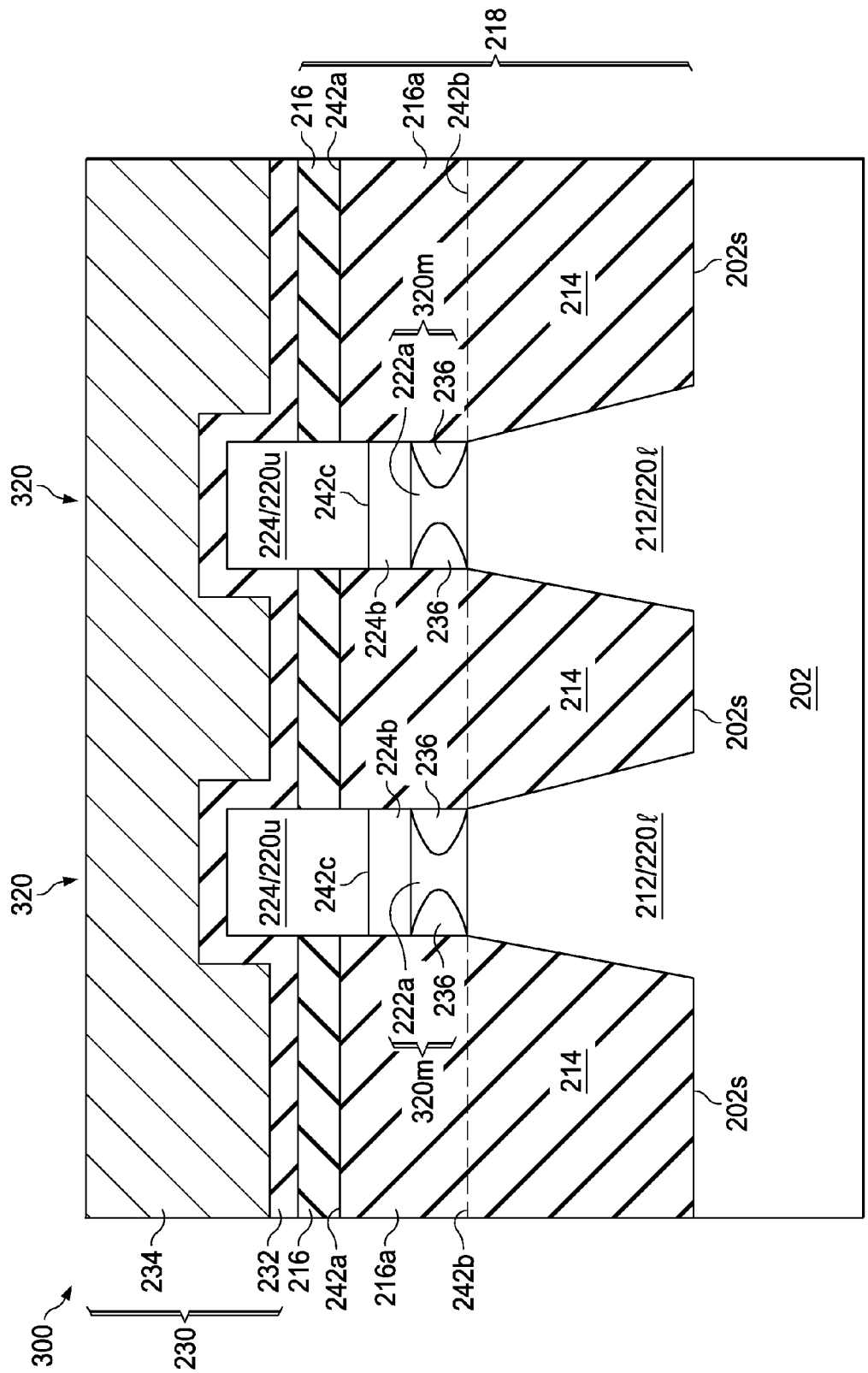

FIG. 2 shows a top view of a fin field effect transistor (FinFET) 200 comprising an isolation structure 218 according to various aspects of the present disclosure. FIGS. 3-11 are cross-sectional views of a FinFET 200 taken along the line a-a of FIG. 2 at various stages of fabrication according to various embodiment of the present disclosure. FIGS. 12 and 13 are cross-sectional views of a FinFET 300 taken along the line a-a of FIG. 2 at various stages of fabrication according to various embodiment of the present disclosure. As employed in the present disclosure, the FinFET 200 or 300 refers to any fin-based, multi-gate transistor. Other transistor structures and analogous structures are within the contemplated scope of the disclosure. The FinFET 200 or 300 may be included in a microprocessor, memory cell, and/or other integrated circuit (IC).

It is noted that the method of FIG. 1 does not produce a completed FinFET 200 or 300. A completed FinFET 200 or 300 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 13 are simplified for a better understanding of the concepts of the present disclosure. For example, although the figures illustrate the FinFET 200 or 300, it is understood the IC may comprise a number of other devices comprising resistors, capacitors, inductors, fuses, etc.

FIG. 2 illustrates a FinFET 200 or 300 fabricated using the steps in FIG. 1. For illustration, the FinFET 200 or 300 comprises a fin structure 220, an isolation structure 218 surrounding the fin structure 220 and a gate structure 230 traversing over channel portion of the fin structure 220. For illustration, the FinFET 200 or 300 comprises two fins. In some embodiments, the FinFET 200 or 300 may comprise less than or greater than two fins, for example, one fin or three fins.

Figure 4:
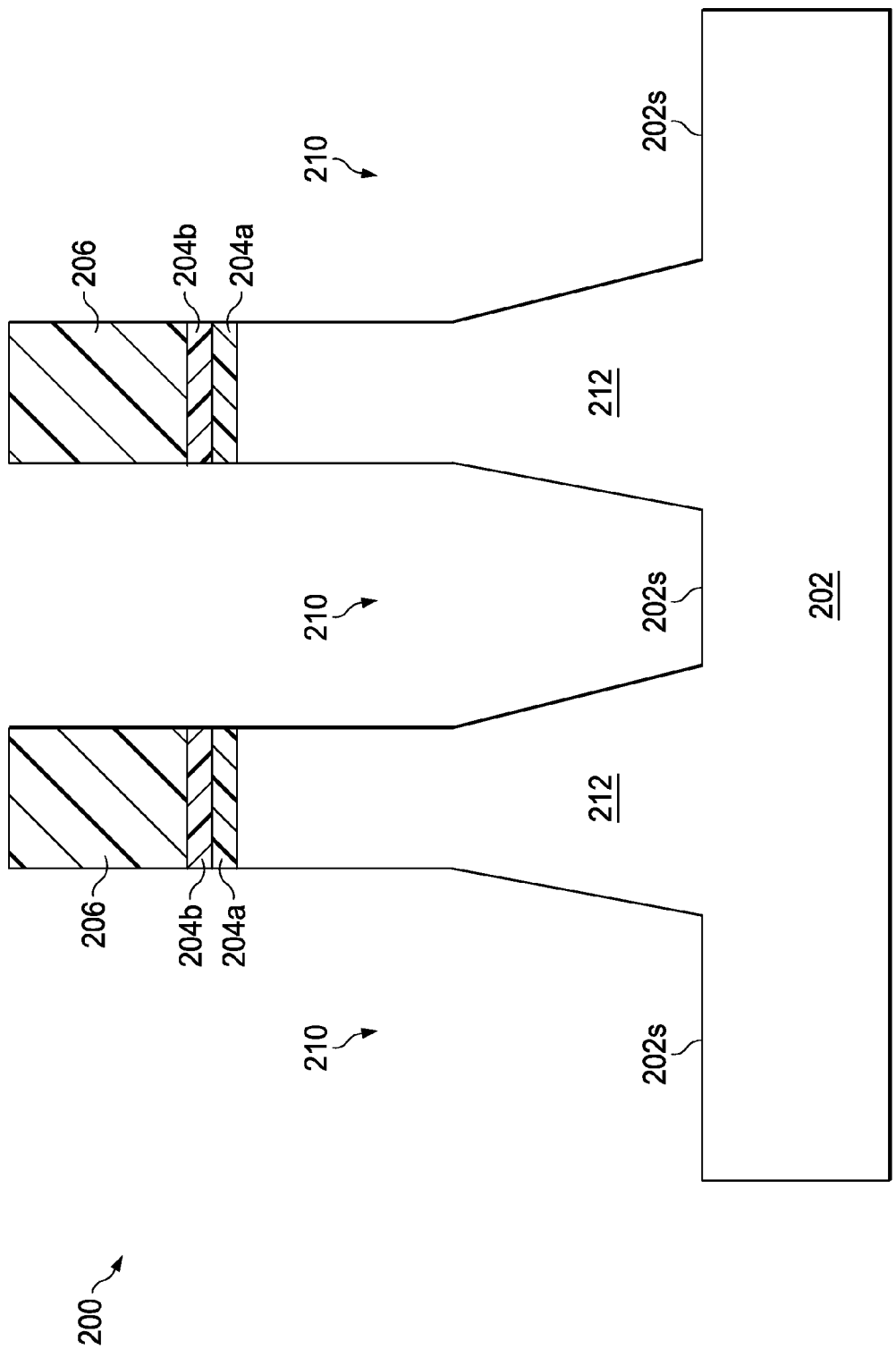
Figure 5:
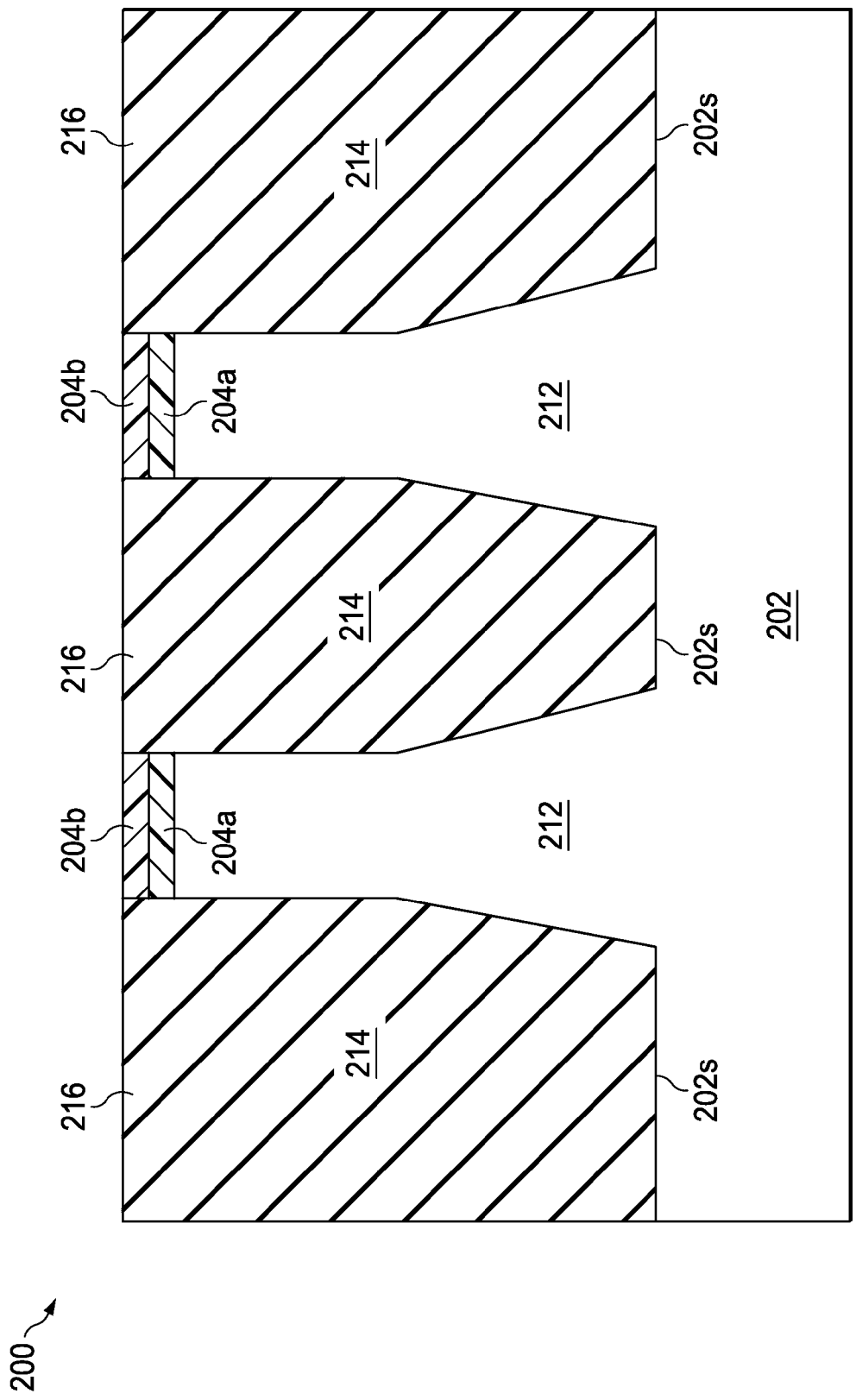

As depicted in FIGS. 3-5, and step 102 in FIG. 1, a substrate 202 having a shallow trench isolation (STI) region 216 surrounding a semiconductor fin 212 is provided (shown in FIG. 3), wherein the substrate 202 comprise a first semiconductor material having a first lattice constant and hence is also referred to as first semiconductor material 202 in the present disclosure. In some embodiments, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof The doped regions may be configured for an n-type FinFET, or alternatively configured for a p-type FinFET.

In some embodiments, the substrate 202 may be made of some other suitable elemental semiconductor, such as a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204a and a mask layer 204b are formed on a top surface 202t of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

As depicted in FIGS. 4 and 5, for forming shallow trench isolation (STI) regions (such as STI regions 216 shown in FIG. 5) within the substrate 202, the structure in FIG. 4 is produced by forming semiconductor fins 212 in the substrate 202. In some embodiments, the mask layer 204b and pad layer 204a are etched through openings 208 to expose underlying semiconductor substrate 202. The exposed semiconductor substrate 202 is then etched to form trenches 210 with major surfaces 202s of the semiconductor substrate 202. Portions of the semiconductor substrate 202 between trenches 210 form the semiconductor fins 212. In some embodiments, the trenches 210 may be strips (viewed from in the top of the FinFET 200 or 300) parallel to each other, and closely spaced with respect to each other. In some embodiments, the trenches 210 may be continuous and surrounding the semiconductor fins 212.

In the depicted embodiment, the semiconductor fins 212 protruding from the substrate major surface 202s comprises two fins. The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

FIG. 5 depicts the resulting structure after the deposition of a dielectric material 214. In some embodiments, the trenches 210 are filled with the dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In some embodiments, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ). A chemical mechanical polish is then performed to form the STI regions 216.

The process steps up to this point have provided the substrate 202 having the STI regions 216 surrounding the semiconductor fins 212. Conventionally, by introducing anti-punch through (APT) dopants into the semiconductor fins 212, each fin of the semiconductor fins 212 is isolated from neighboring fins. However, substrate punch through effect in semiconductor fins 212 may occur if some APT dopants diffuse from semiconductor fins 212 into STI regions 216. Insufficient remaining APT dopants in semiconductor fins 212 may provide a carrier transportation path between adjacent fins and cause high leakage current of the FinFET, thereby degrading the device performance.

Accordingly, the processing discussed below with reference to FIGS. 6-9 may form a doped portion in the STI region 216 to impede ATP dopants out-diffusion from semiconductor fin 212. Problems associated with high leakage current due to insufficient APT dopants may be reduced and/or avoided. Thus, Applicant's method may achieve the desired device performance characteristics, such as punch-through effect and leakage.

Figure 6:
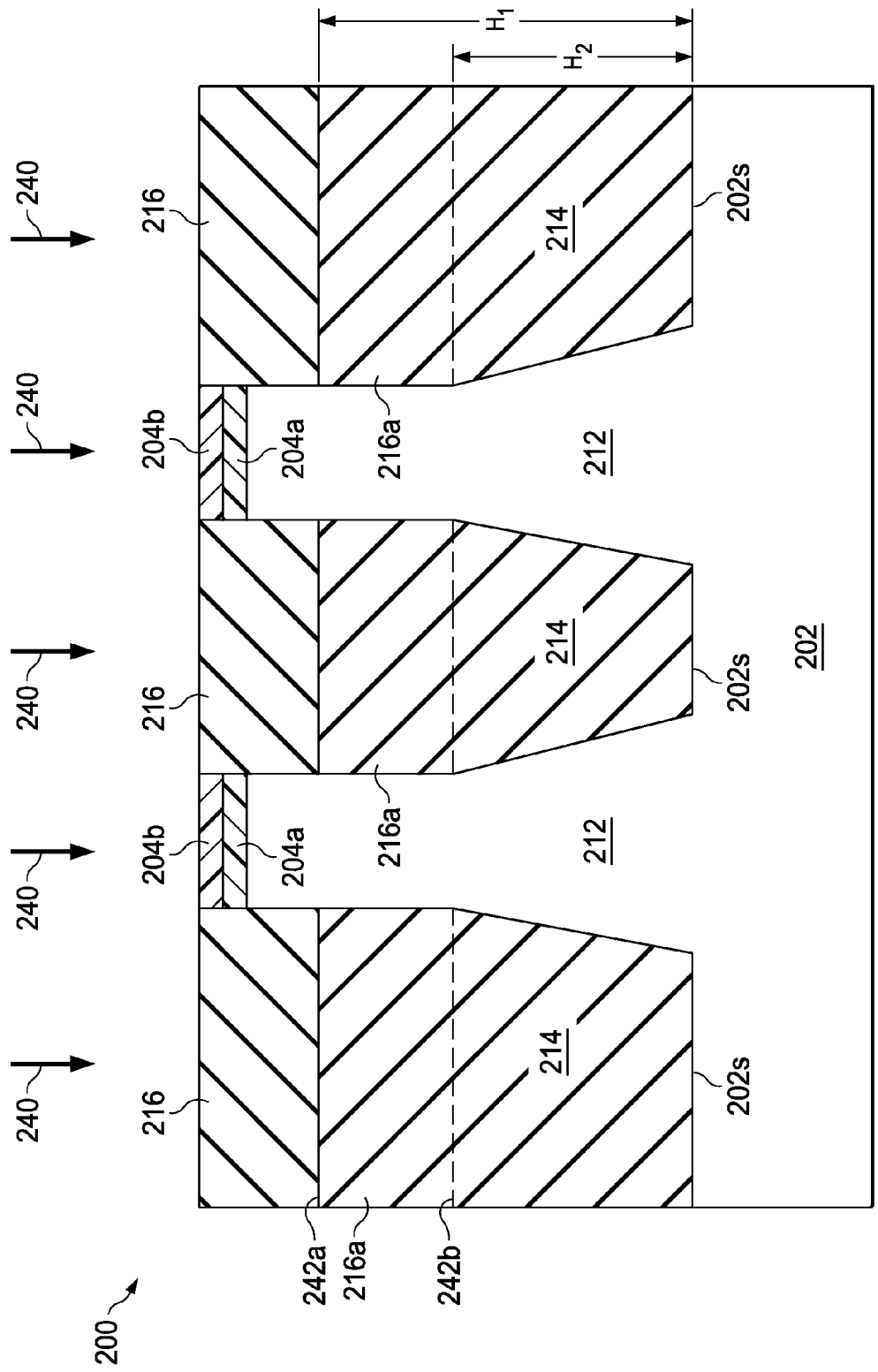

As depicted in FIG. 6 and step 104 in FIG. 1, for fabricating a doped portion in the STI region 216 to enhance device performance, the structure in FIG. 6 is produced by performing a first implantation process 240 to the STI region 216, whereby a doped portion 216a of the STI region 216 comprises a dopant 242 with a peak concentration 242a or 242b. In some embodiments, the dopant 242 comprises B or $BF_2$. The doped portion 216a in the STI region 216 may impede ATP dopants out-diffusion from the semiconductor fin 212 (shown in FIG. 9).

In some embodiment, using the mask layer 204b and pad layer 204a as a hard mask, the step of performing a first implantation process 240 to the STI region 216 is performed at an energy between about 50 to 100 KeV and at a dose between about $1*10^{13}$ to $1*10^{14}$ atoms/$cm^2$. As a result of the implantation process 240, rather than implanting into the semiconductor fin 212, the peak concentration 242a or 242b of the dopant 242 is generated in the doped portion 216a of the STI region 216 adjacent to the semiconductor fin 212. A height of the peak concentration 242a or 242b and the substrate surface 202s depends on the implantation energy. In some embodiments, a first peak concentration 242a of the dopant 242 with 60 KeV (lower energy) has a first height $H_1$ (solid line). In some embodiments, a second peak concentration 242b of the dopant 242 with 120 KeV (higher energy) has second height $H_2$ less than the first height $H_1$ (dashed line). In some embodiments, the STI region 216 may comprise the first peak concentration 242a and second peak concentration 242b if the implantation process 240 is performed with different implantation energies at different time.

The mask layer 204b and pad layer 204a are then removed. In one embodiment, the mask layer 204b is formed of silicon nitride, the mask layer 204b may be removed using a wet process using hot $H_3PO_4$, while pad layer 204a may be removed using diluted HF acid, if formed of silicon oxide.

Figure 7:
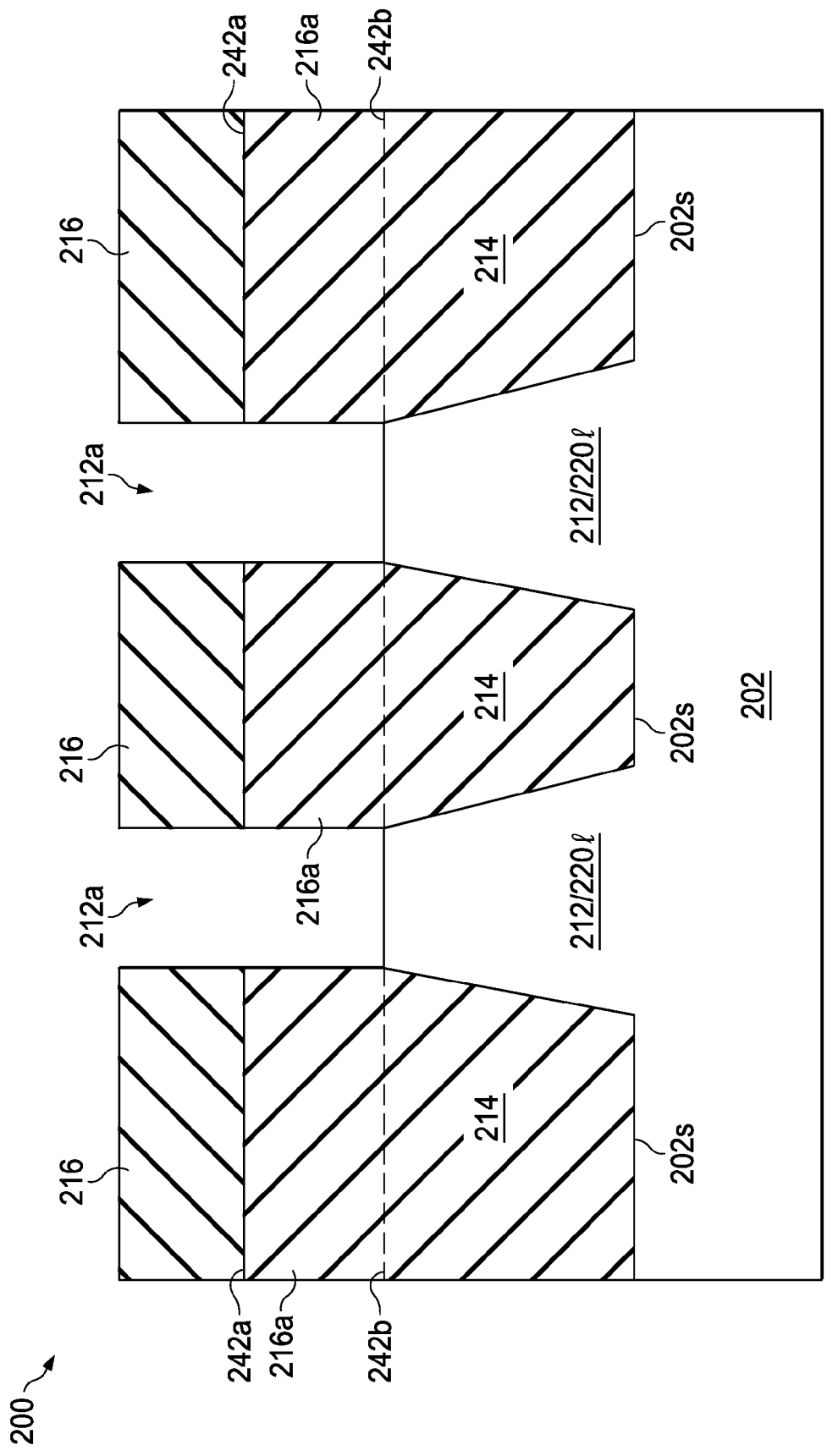
Figure 8:
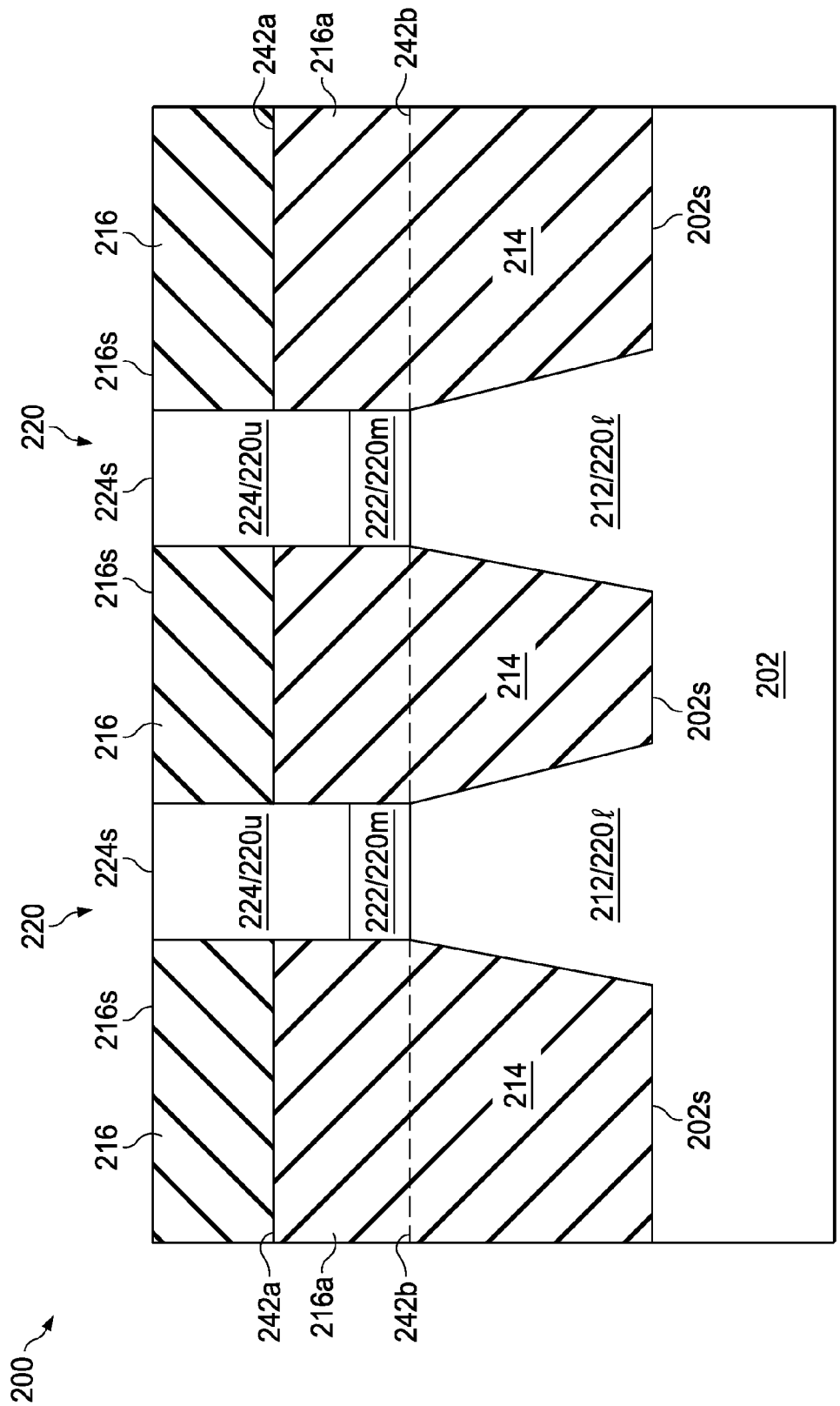

As depicted in FIGS. 7 and 8, upper portions of the semiconductor fins 212 are replaced by other semiconductor material to enhance device performance. Using the STI regions 216 as a hard mask, an anisotropic plasma etching process is performed to recess semiconductor fins 212 that are unprotected or exposed to form fin recesses 212a between the neighboring STI regions 216 (shown in FIG. 7 and step 106 in FIG. 1). The remaining portions of the semiconductor fins 212 between the neighboring STI regions 216 are hereinafter referred to as lower portion 220l of the fin structure 220, protruding from the major surface 202s of the substrate 202. In some embodiments, the lower portion 220l may include the first semiconductor material 202 having the first lattice constant. In some embodiments, the first semiconductor material 202 comprises Si or III-V semiconductor material. In some embodiments, the etching process may be performed using a chemical selected from $Cl_2$, HBr, $NF_3$, $CF_4$, and $SF_6$ as an etching gas.

Next, the structure of FIG. 8 is produced by selectively growing a second semiconductor material 222 partially filling in the fin recess 212a, wherein the second semiconductor material 222 has a second lattice constant different from the first lattice constant (step 108 in FIG. 1). In some embodiments, the second semiconductor material 222 comprises Ge or SiGe. Further, the second semiconductor material 222 is hereinafter referred to as a middle portion 220m of the fin structure 220.

In some embodiments, the second semiconductor material 222 comprises Ge. In the depicted embodiment, the second semiconductor material 222 such as Ge is selectively grown by an LPCVD process to partially fill the fin recess 212a. In one embodiment, the LPCVD process is performed at a temperature of about 350° C. to 450° C. and under a pressure of about 10 mTorr to 100 mTorr, using $GeH_4$, $GeH_3CH_3$, and/or $(GeH_3)_2CH_2$ as epitaxial gases. Optionally, an anneal process after the growing process is performed at a temperature of about 550° C. to 750° C. to confine dislocation defects on the interface of the Si and Ge epitaxial layer.

In some embodiments, the second semiconductor material 222 comprises SiGe. In the depicted embodiment, the second semiconductor material 222 such as SiGe is selectively grown by an LPCVD process to partially fill the fin recess 212a. In one embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases.

Still referring to FIG. 8, subsequent to the formation of the second semiconductor material 222, the structure of FIG. 8 is produced by selectively growing a third semiconductor material 224 filling in the fin recess 212a (step 110 in FIG. 1), wherein the third semiconductor material 224 is substantially the same material as the first semiconductor material 202 having the first lattice constant.

In some embodiments, the third semiconductor material 224 comprises Si. In the depicted embodiment, the third semiconductor material 224 such as Si is selectively grown by an LPCVD process to fill the fin recess 212a. In the depicted embodiment, the LPCVD process is performed at a temperature of about 400 to 800° C. and under a pressure of about 1 to 100 Torr, using $SiH_4$, and $H_2$ as reaction gases.

After the growing, a planarization such as a CMP is performed, so that a top surface 224s of the third semiconductor material 224 is substantially level with a top surface 216s of the STI regions 216. In some embodiments, the third semiconductor material 224 forms upper portions 220u of the fin structure 220. As such, the fin structure 220 comprises the lower portion 220l, upper portion 220u, and middle portion 220m between the lower portion 220l and upper portion 220u.

Figure 9:
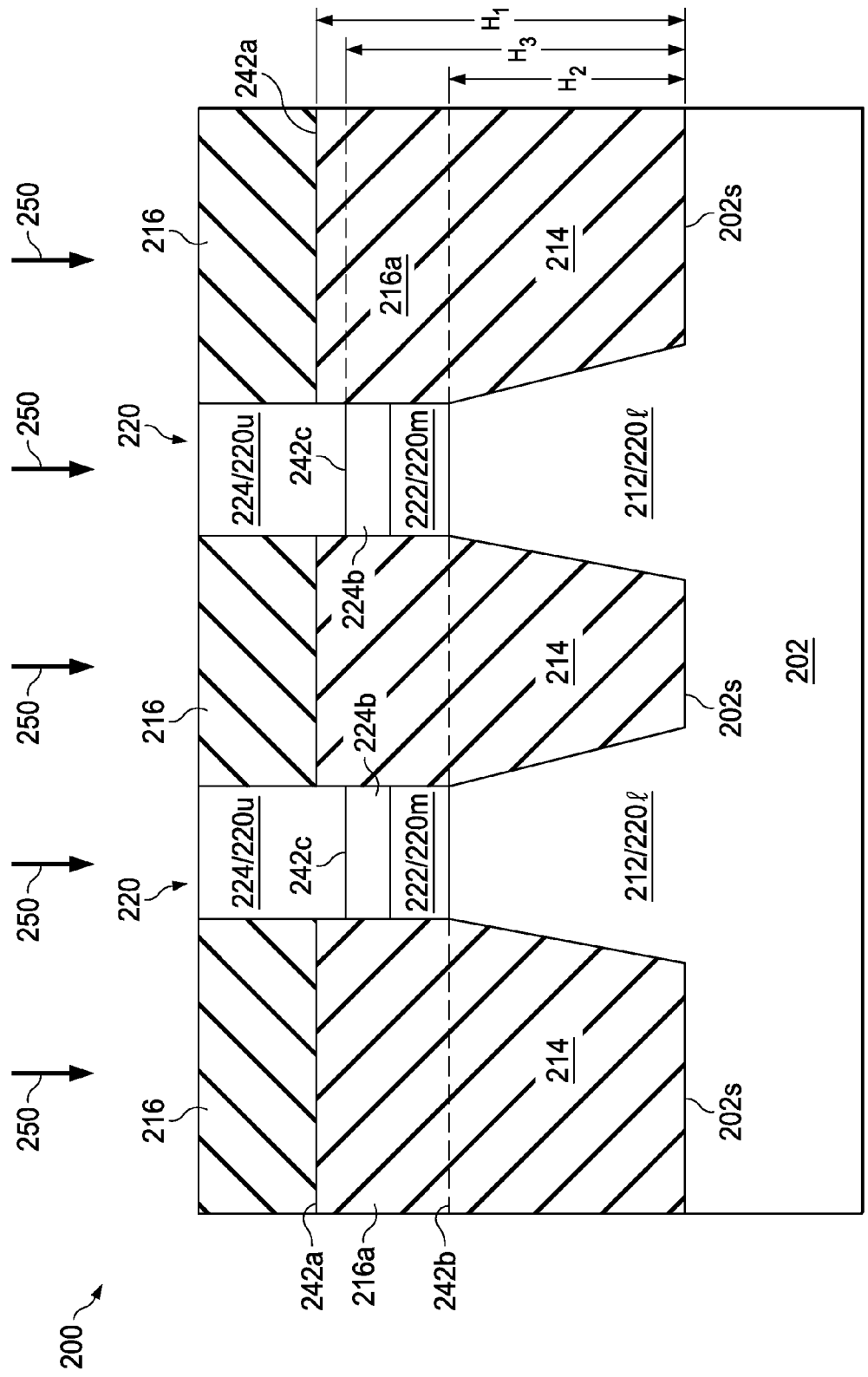

As depicted in FIG. 9 and step 112 in FIG. 1, after forming the fin structure 220, the structure in FIG. 9 is produced by performing a second implantation process 250 to the third semiconductor material 224, wherein a bottom portion of the third semiconductor material 224 comprises the dopant 242 with a third peak concentration 242c equal to or less than the peak concentration 242a or 242b. In some embodiments, a ratio of the peak concentration 242a or 242b (with more implantation time) to the third peak concentration 242c (with less implantation time) is from about 2 to about 4. In the depicted embodiment, the third peak concentration 242c of the dopant 242 acts as APT dopants in the semiconductor fins 212, each fin of the semiconductor fins 212 is thus isolated from neighboring fins.

In some embodiment, the step of performing a second implantation process 250 to the third semiconductor material 224 is performed at an energy between about 50 to 100 KeV and at a dose between about $1*10^{13}$ to $1*10^{14}$ atoms/cm$^2$. As a result of the second implantation process 250, the third peak concentration 242c of the dopant 242 is generated in a bottom portion 224b of the third semiconductor material 224 adjacent to the doped portion 216a of the STI region 216, while a fourth peak concentration (not shown) of the dopant 242 is generated in the doped portion 216a of the STI region 216 adjacent to the bottom portion 224b of the third semiconductor material 224.

In lower-energy embodiment, a first height $H_1$ between a point of the first peak concentration 242a and the major surface 202s is equal to or greater than a third height $H_3$ between a point of the third peak concentration 242c and the major surface 202s. In some embodiments, a ratio of the first height $H_1$ to the third height $H_3$ is from about 1 to about 1.5.

In higher-energy embodiment, a second height $H_2$ between a point of the second peak concentration 242b and the major surface 202s is less than a third height $H_3$ between a point of the third peak concentration 242c and the major surface 202s. In some embodiments, a ratio of the second height $H_2$ to the third height $H_3$ is from about 0.5 to about 0.9.

Figure 10:
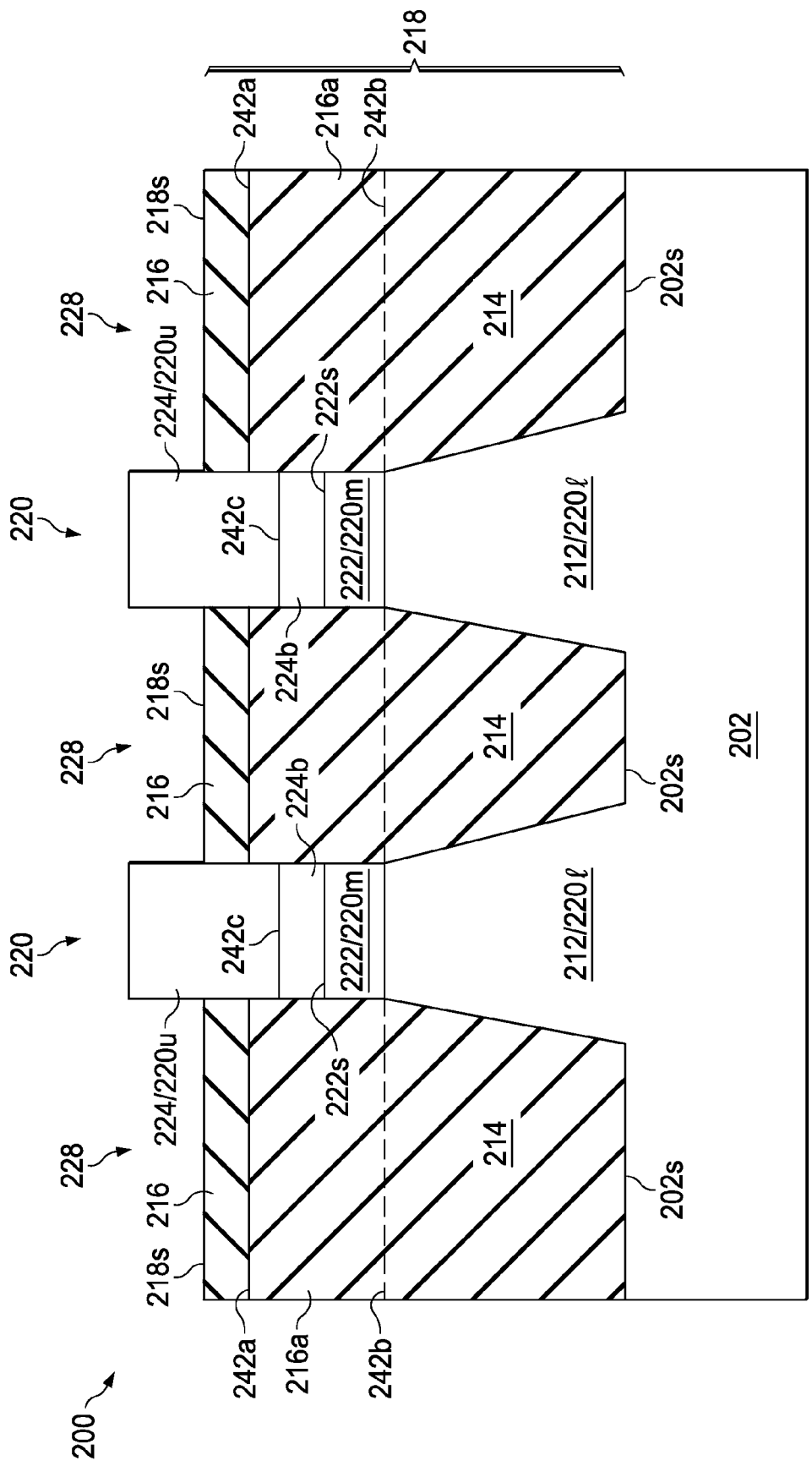
Figure 11:
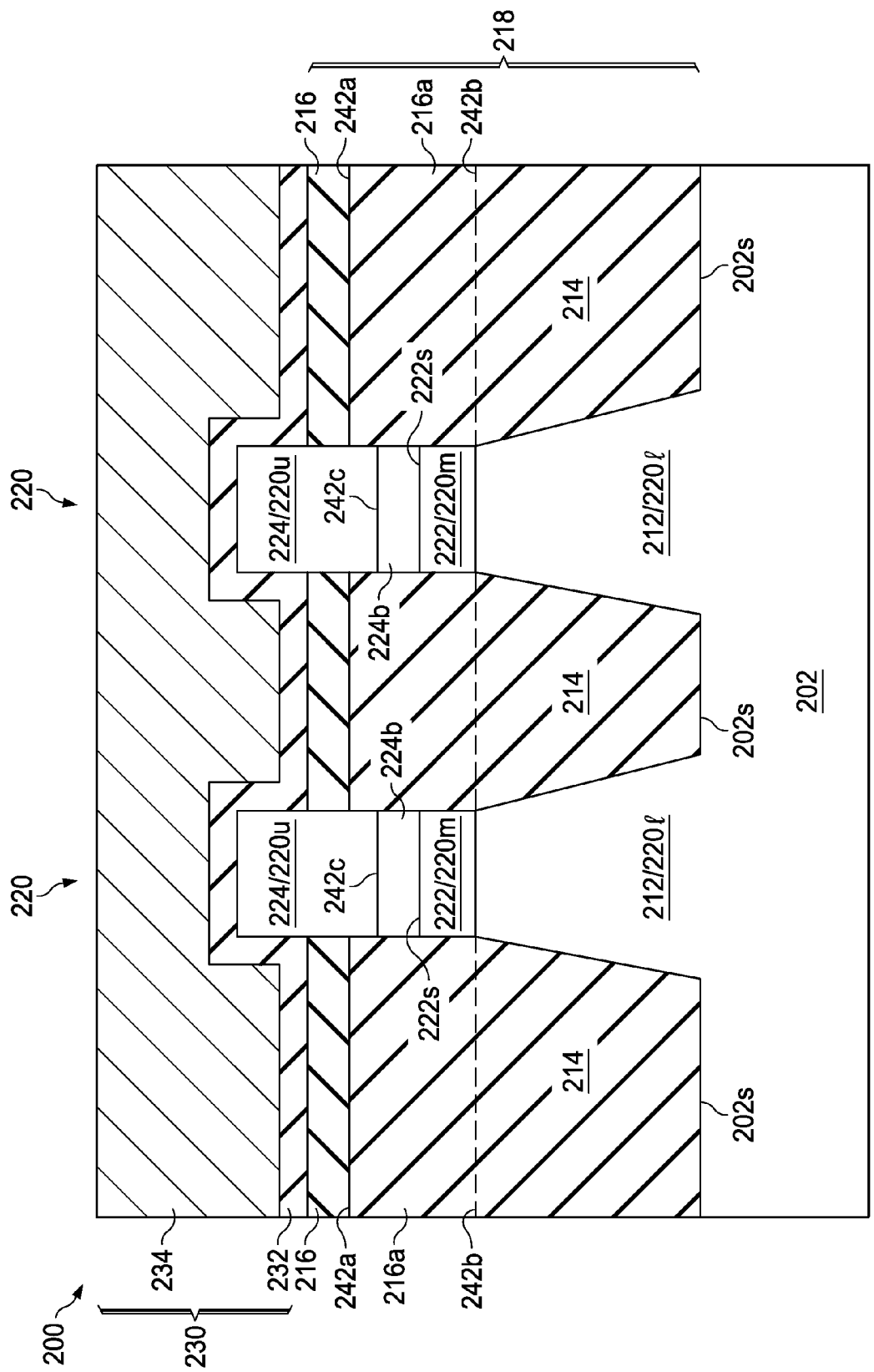

Next, the STI regions 216 are recessed by an etching step to expose a portion of the upper portion 220u, resulting in recesses 228 and a remaining oxide 214 (shown in FIG. 10). The remaining oxide 214 surrounding the fin structure 220 is hereinafter referred to as an isolation structure 218, wherein a top surface 218s of the isolation structure 218 is higher than a top surface 222s of the second semiconductor material 222. In some embodiments, the etching step may be performed using a wet etching process, for example, by dipping the substrate 202 in hydrofluoric acid (HF). In some embodiments, the etching step may be performed using a dry etching process, for example, the dry etching process may be performed using CHF₃ or BF₃ as etching gases. In the depicted embodiment, the exposed portion (i.e., the portion of the upper portion 220*u*) comprises source/drain (S/D) portions and a channel portion between the S/D portions. In some embodiments, a gate structure 230 comprising a gate dielectric 232 and a gate electrode 234 traverses over channel portion of the fin structure 220 (shown in FIG. 11).

As such, the FinFET 200 comprises the substrate 202 comprising the major surface 202*s*; the fin structure 220 protruding from the major surface 202*s* comprising the lower portion 220*l* comprising the first semiconductor material 202 having a first lattice constant; the upper portion 220*u* comprising the first semiconductor material 202, wherein the bottom portion 224*b* of the upper portion 220*u* comprises the dopant 242 with the third peak concentration 242*c*; the middle portion 220*m* between the lower portion 220*l* and upper portion 220*u*, wherein the middle portion 220*m* comprises the second semiconductor material 222 having a second lattice constant different from the first lattice constant; and an isolation structure 218 surrounding the fin structure 220, wherein a doped portion 216*a* of the isolation structure 218 adjacent to the bottom portion 224*b* of the upper portion 220*u* comprises the dopant 242 with the first or second peak concentration 242*a* or 242*c* equal to or greater than the third peak concentration 242*c*. Thus, using the isolation structure 218 with the dopant 242 to impede ATP dopants out-diffusion from the fin structure 220, Applicant's method may achieve the desired device performance characteristics, such as APT effect and leakage.

FIGS. 12 and 13 are cross-sectional views of a FinFET 300 at various stages of fabrication according to various embodiment of the present disclosure. FIG. 12 shows the FinFET 300 (200 in FIG. 10) after forming a pair of notches in the fin structure 220. The structure in FIG. 12 is produced by performing an oxidation process 260 to the substrate 202 to form a pair of notches 236 extending into opposite sides of the middle portion 220*m*.

As a result of the oxidation, rather than oxidizing outer surfaces of the upper portion 220*u* (with low strain or no strain), the pair of notches 236 is generated adjacent to the second semiconductor material 222 (with high strain). In some embodiments, the pair of notches 236 extends into opposite sides of the second semiconductor material 222 (i.e., in an inward direction) and further extends into an upper edge portion of the first semiconductor material 202 and a lower edge portion of the third semiconductor material 224. In some embodiments, the pair of notches 236 comprises GeO$_x$ or SiGeO$_x$. In some embodiments, a gate structure 230 comprising a gate dielectric 232 and a gate electrode 234 traverses over channel portion of the fin structure 220 (shown in FIG. 13).

In the depicted embodiment, the pair of notches 236 and remaining second semiconductor material 222*a* are combined and also hereinafter referred to as a middle portion 320*m* of a fin structure 320. In some embodiments, the upper portion 220*u*, middle portion 320*m*, and lower portion 220*l* are combined and also hereinafter referred to as the fin structure 320.

As such, the FinFET 300 comprises the substrate 202 comprising the major surface 202*s*; the fin structure 320 protruding from the major surface 202*s* comprising the lower portion 220*l* comprising the first semiconductor material 202 having a first lattice constant; the upper portion 220*u* comprising the first semiconductor material 202, wherein the bottom portion 224*b* of the upper portion 220*u* comprises the dopant 242 with the third peak concentration 242*c*; the middle portion 320*m* between the lower portion 220*l* and upper portion 220*u*, wherein the middle portion 320*m* comprises the second semiconductor material 222*a* having a second lattice constant different from the first lattice constant; the pair of notches 236 extending into opposite sides of the middle portion 320*m*; and an isolation structure 218 surrounding the fin structure 320, wherein the doped portion 216*a* of the isolation structure 218 adjacent to the bottom portion 224*b* of the upper portion 220*u* comprises the dopant 242 with the first or second peak concentration 242*a* or 242*b* equal to or greater than the third peak concentration 242*c*.

Thus, using the isolation structure 218 with the dopant 242 to impede ATP dopants out-diffusion from the fin structure 320, and further using the fin structure 320 with the pair of notches 236 to narrower carrier transportation path between adjacent fins, Applicant's method may achieve the desired device performance characteristics, such as APT effect and leakage.

It is understood that the FinFET 200 or 300 may undergo further CMOS processes to form various features such as contacts/vias, interconnect metal layers, dielectric layers, passivation layers, etc.

In accordance with embodiments, a fin field effect transistor (FinFET) comprises a substrate comprising a major surface; a fin structure protruding from the major surface comprising a lower portion comprising a first semiconductor material having a first lattice constant; an upper portion comprising the first semiconductor material, wherein a bottom portion of the upper portion comprises a dopant with a first peak concentration; a middle portion between the lower portion and upper portion, wherein the middle portion comprises a second semiconductor material having a second lattice constant different from the first lattice constant; and an isolation structure surrounding the fin structure, wherein a portion of the isolation structure adjacent to the bottom portion of the upper portion comprises the dopant with a second peak concentration equal to or greater than the first peak concentration.

In accordance with another embodiments, a fin field effect transistor (FinFET) comprises a substrate comprising a major surface; a fin structure protruding from the major surface comprising a lower portion comprising a first semiconductor material having a first lattice constant; an upper portion comprising the first semiconductor material, wherein a bottom portion of the upper portion comprises a dopant with a first peak concentration; a middle portion between the lower portion and upper portion, wherein the middle portion comprises a second semiconductor material having a second lattice constant different from the first lattice constant; a pair of notches extending into opposite sides of the middle portion; and an isolation structure surrounding the fin structure, wherein a portion of the isolation structure adjacent to the bottom portion of the upper portion comprises the dopant with a second peak concentration equal to or greater than the first peak concentration.

In accordance with another embodiments, a method of fabricating a fin field effect transistor comprises providing a substrate having a shallow trench isolation (STI) region surrounding a semiconductor fin, wherein the substrate comprises a first semiconductor material having a first lattice constant; performing a first implantation process to the STI region, whereby a portion of the STI region comprises a dopant with a first peak concentration; recessing the semiconductor fin to form a fin recess; selectively growing a second semiconductor material partially filling in the fin recess, wherein the second semiconductor material has a second lattice constant different from the first lattice constant; selectively growing a third semiconductor material filling in the fin recess; and performing a second implantation process to the third semiconductor material, wherein a bottom portion of the third semiconductor material comprises the dopant with a second peak concentration equal to or less than the first peak concentration.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fin field effect transistor (FinFET) comprising:
a substrate comprising a major surface;
a fin structure protruding from the major surface, the fin structure comprising:
   a lower portion comprising a first semiconductor material having a first lattice constant;
   an upper portion comprising the first semiconductor material, wherein a bottom portion of the upper portion comprises a dopant with a first peak concentration; and
   a middle portion between the lower portion and upper portion, wherein the middle portion comprises a second semiconductor material having a second lattice constant different from the first lattice constant; and
an isolation structure adjacent to the fin structure;
wherein:
   a first region of the isolation structure laterally adjacent to the bottom portion of the upper portion comprises the dopant with a second peak concentration equal to or greater than the first peak concentration;
   a second region of the isolation structure laterally adjacent to a bottom portion of the middle portion, the second region comprising the dopant with a third peak concentration equal to or greater than the first peak concentration; and
   a third region of the isolation structure laterally adjacent to a portion of the upper portion above the bottom portion of the upper portion, the third region comprising the dopant with a fourth peak concentration equal to or greater than the first peak concentration.

2. The FinFET of claim 1, wherein at least one of:
a first ratio of the third peak concentration to the first peak concentration is from about 2 to about 4; or
a second ratio of the fourth peak concentration to the first peak concentration is from about 2 to about 4.

3. The FinFET of claim 1, wherein the dopant comprises B or $BF_2$.

4. The FinFET of claim 1, wherein a first height between a point of the first peak concentration and the major surface is equal to or greater than a second height between a point of the second peak concentration and the major surface.

5. The FinFET of claim 4, wherein a ratio of a third height between a point of the fourth peak concentration and the major surface to the first height is from about 1 to about 1.5.

6. The FinFET of claim 1, wherein a first height between a point of the third peak concentration and the major surface is less than a second height between a point of the second peak concentration and the major surface.

7. The FinFET of claim 6, wherein a ratio of the first height to the second height is from about 0.5 to about 0.9.

8. A fin field effect transistor (FinFET) comprising:
a substrate comprising a major surface;
a fin structure protruding from the major surface, the fin structure comprising:
   a lower portion comprising a first semiconductor material having a first lattice constant;
   an upper portion comprising the first semiconductor material, wherein a bottom portion of the upper portion comprises a dopant with a first peak concentration; and
   a middle portion between the lower portion and upper portion, wherein the middle portion comprises a second semiconductor material having a second lattice constant different from the first lattice constant;
a pair of notches extending into opposite sides of the middle portion; and
an isolation structure surrounding the fin structure, wherein a portion of the isolation structure adjacent to the bottom portion of the upper portion comprises the dopant with a second peak concentration greater than the first peak concentration.

9. The FinFET of claim 8, wherein a ratio of the second peak concentration to the first peak concentration is from about 2 to about 4.

10. The FinFET of claim 8, wherein the dopant comprises B or $BF_2$.

11. The FinFET of claim 8, wherein a first height between a point of the first peak concentration and the major surface is equal to or greater than a second height between a point of the second peak concentration and the major surface.

12. The FinFET of claim 11, wherein a ratio of the first height to the second height is from about 1 to about 1.5.

13. The FinFET of claim 8, wherein a first height between a point of the first peak concentration and the major surface is less than a second height between a point of the second peak concentration and the major surface.

14. The FinFET of claim 13, wherein a ratio of the first height to the second height is from about 0.5 to about 0.9.

15. The FinFET of claim 8, wherein the pair of notches comprises $GeO_x$ or $SiGeO_x$.

16. A fin field effect transistor (FinFET) comprising:
a semiconductor substrate having a major surface;
a fin extending from the major surface of the semiconductor substrate, the fin including:
   a lower portion comprising a first material having a first lattice constant,
   a middle portion on the lower portion, the middle portion comprising a second material having a second lattice constant different than the first lattice constant, and
   an upper portion on the middle portion, the upper portion including a region doped with a dopant at a first peak concentration; and
an isolation layer surrounding the upper portion of the fin, the isolation layer including a region doped with the dopant at a second peak concentration, the second peak concentration being greater than the first peak concentration.

17. The FinFET of claim 16, wherein the region of the upper portion doped with a dopant is vertically proximate the middle portion.

18. The FinFET of claim 16, wherein the upper portion of the fin comprises the first material.

19. The FinFET of claim 16, further comprising a notch extending from an outer periphery into an interior part of the middle portion.

20. The FinFET of claim 19, wherein the second material comprises a semiconductor material and wherein the notch is an oxide of the semiconductor material.

* * * * *